(12) United States Patent
Afan et al.

(10) Patent No.: US 12,345,398 B2
(45) Date of Patent: Jul. 1, 2025

(54) CONNECTORS FOR LINEAR LIGHTING

(71) Applicant: Elemental LED, Inc., Reno, NV (US)

(72) Inventors: Kenneth A. Afan, Oceanside, CA (US); James A. Peña, Vista, CA (US)

(73) Assignee: Elemental LED, Inc., Reno, NV (US)

( * ) Notice: Subject to any disclaimer, the term of this patent is extended or adjusted under 35 U.S.C. 154(b) by 355 days.

(21) Appl. No.: 18/164,071

(22) Filed: Feb. 3, 2023

(65) Prior Publication Data
US 2023/0250947 A1 Aug. 10, 2023

Related U.S. Application Data

(60) Provisional application No. 63/306,620, filed on Feb. 4, 2022.

(51) Int. Cl.
| | | |
|---|---|---|
| *F21V 23/06* | (2006.01) | |
| *H01R 4/36* | (2006.01) | |
| *H01R 4/50* | (2006.01) | |
| *H01R 12/52* | (2011.01) | |
| *H05K 1/11* | (2006.01) | |
| *H01L 25/13* | (2006.01) | |

(52) U.S. Cl.
CPC .............. *F21V 23/06* (2013.01); *H01R 4/363* (2013.01); *H01R 4/5008* (2013.01); *H01R 12/52* (2013.01); *H05K 1/11* (2013.01); *H01L 25/13* (2013.01); *H05K 2201/09236* (2013.01); *H05K 2201/0939* (2013.01); *H05K 2201/10287* (2013.01)

(58) Field of Classification Search
CPC ........ H01R 12/79; H01R 12/52; H01R 12/62; H01R 12/82–89
See application file for complete search history.

(56) References Cited

U.S. PATENT DOCUMENTS

| | | | | |
|---|---|---|---|---|
| 5,980,307 | A | * | 11/1999 | Brewster ................ H05K 3/301 439/493 |
| 6,027,363 | A | * | 2/2000 | Watt ..................... H01R 12/772 439/456 |
| 9,909,743 | B2 | | 3/2018 | Dankelmann et al. |
| 10,591,114 | B1 | | 3/2020 | Lassen et al. |
| 10,727,621 | B1 | | 7/2020 | Senofsky et al. |
| 10,826,202 | B1 | | 11/2020 | Lowe et al. |
| 11,043,762 | B1 | | 6/2021 | Kalliche |
| 12,085,245 | B2 | * | 9/2024 | Wang .................. F21V 19/0015 |
| 2019/0036246 | A1 | | 1/2019 | Stone et al. |

OTHER PUBLICATIONS

International Search Report and Written Opinion for PCT/US2023/61941, mailed Sep. 19, 2023.

* cited by examiner

*Primary Examiner* — Ross N Gushi
(74) *Attorney, Agent, or Firm* — Andrew McAleavey

(57) ABSTRACT

A connector for a strip of linear lighting includes an outer shell or block and an adapter configured to be removably inserted into a cavity of the outer shell. The adapter may be a printed circuit board (PCB) adapted to mount wires on one side or edge. On the opposite side or edge, a series of contact pins are formed on the underside of the adapter. The outer shell includes a pressure-applying mechanism, like screws that insert through its thickness and are secured in a bar with threaded holes. The adapter is positioned such that the screws bear on and supply pressure to the contact pins. A strip of linear lighting is inserted into a slot beneath the adapter such that the contact pins of the adapter coincide with the solder pads or other electrical contacts of the strip of linear lighting.

21 Claims, 3 Drawing Sheets

CONNECTORS FOR LINEAR LIGHTING

CROSS-REFERENCE TO RELATED APPLICATIONS

This application claims priority to, and the benefit of, U.S. Provisional Patent Application No. 63/306,620, filed Feb. 4, 2022, the contents of which are incorporated by reference herein in their entirety.

TECHNICAL FIELD

The invention relates to connectors for linear lighting.

BACKGROUND

Linear lighting is a class of solid-state lighting in which light-emitting diode (LED) light engines are mounted on an elongate, narrow printed circuit board (PCB). The PCB may be either flexible or rigid. Particularly if the PCB is flexible, lengths of the PCB may be soldered together at overlapping joints to create a strip of linear lighting of arbitrary length.

Linear lighting may include many different types of light engine, often on the same strip. Light engines that are intended to emit white light are often of the so-called "blue pump" type, in which a blue LED is packaged with a phosphor that absorbs the blue light and re-emits it in a broader or different spectrum. Other light engines may include independently-controlled red, green, and blue LEDs in a single package. These so-called RGB LED light engines are capable of emitting red, green, or blue light, or of additively mixing red, green, and blue light to create a wide range of colors. While it is possible to additively mix red, green, and blue light to create white light, the color temperature and quality of that white light may not be desirable for all applications. Thus, some multi-color light engines have red, green, and blue LEDs as well as separate blue-pump white-light emitters (i.e., a blue LED separated from the RGB trio and covered with a phosphor to emit white light).

A single type of white-light-emitting LED light engine usually requires only two terminals or electrical connections to provide power and control: a voltage terminal and a minus-return or ground terminal. When different types of LED light engines are installed in a strip of linear lighting, or when the installed light engines each include more than one type of LED, more terminals or electrical connections are usually required to provide power and control.

A strip of linear lighting that uses RGB light engines, or a combination of RGB and white-light engines, may have, e.g., five or six solder pads spaced closely together on the strip. These solder pads are often located adjacent to one another, and because it is necessary to place more solder pads in the same area, solder pads in a group of five or six are commensurately smaller than the solder pads of a two-connection strip of linear lighting. Connections to these numerous, small solder pads are often made by soldering wires to the solder pads.

However, soldering is a difficult and perishable skill, and when there are many small solder pads, soldering becomes even more difficult. The most reliable soldering is typically done in the factory by skilled operators or automatically by machine. Many manufacturers do not recommend field-soldering of linear lighting because of the potential that inexperience, or work done in the uncontrolled environment of an ongoing installation, could damage the product. Yet factory-soldered linear lighting often provides little opportunity for an installer in the field to customize or configure the linear lighting for a particular installation.

BRIEF SUMMARY

One aspect of the invention relates to a connector for a strip of linear lighting. The connector includes an outer shell or block and an adapter. The adapter may take the form of a printed circuit board (PCB) with wires mounted on one side or edge. On an opposite side, a series of contact pins are formed on the underside of the adapter. The adapter is removably inserted into the outer shell or block. The outer shell or block includes screws that insert through its thickness and are secured in a bar with threaded holes. The adapter is positioned such that the screws bear on and supply pressure to the side of the adapter on which the contact pins are formed. A strip of linear lighting is inserted into a slot beneath the adapter such that the contact pins of the adapter coincide with the solder pads or other electrical contacts of the strip of linear lighting. Tightening the screws supplies pressure to hold the strip of linear lighting in place and to maintain the electrical connection. With this arrangement, fewer screws can be used than in a typical linear lighting connector, and contact pins can be placed at any pitch. The design is also modular, in that an adapter with different features can be used with the same outer shell or block to connect to a different type of linear lighting.

Another aspect of the invention also relates to a connector. A connector according to this aspect of the invention retains the two-part outer shell or block and adapter arrangement described above. However, in this embodiment, the outer shell or block has a lever pivotally mounted in an upper portion. The lever includes a cam with a lobe sized and positioned such that when the lever is rotated down against the outer shell or body, the cam rotates into position over the edge of the adapter with contact pins and supplies force to push the contact pins into positive engagement with a strip of linear lighting positioned beneath them. Thus, a connector according to this aspect of the invention does not require individually-tightened screws to supply pressure.

Other aspects, features, and advantages of the invention will be set forth in the description that follows.

BRIEF DESCRIPTION OF THE DRAWING FIGURES

The invention will be described with respect to the following drawing figures, in which like numerals represent like features throughout the description, and in which.

DETAILED DESCRIPTION

Figure 1:
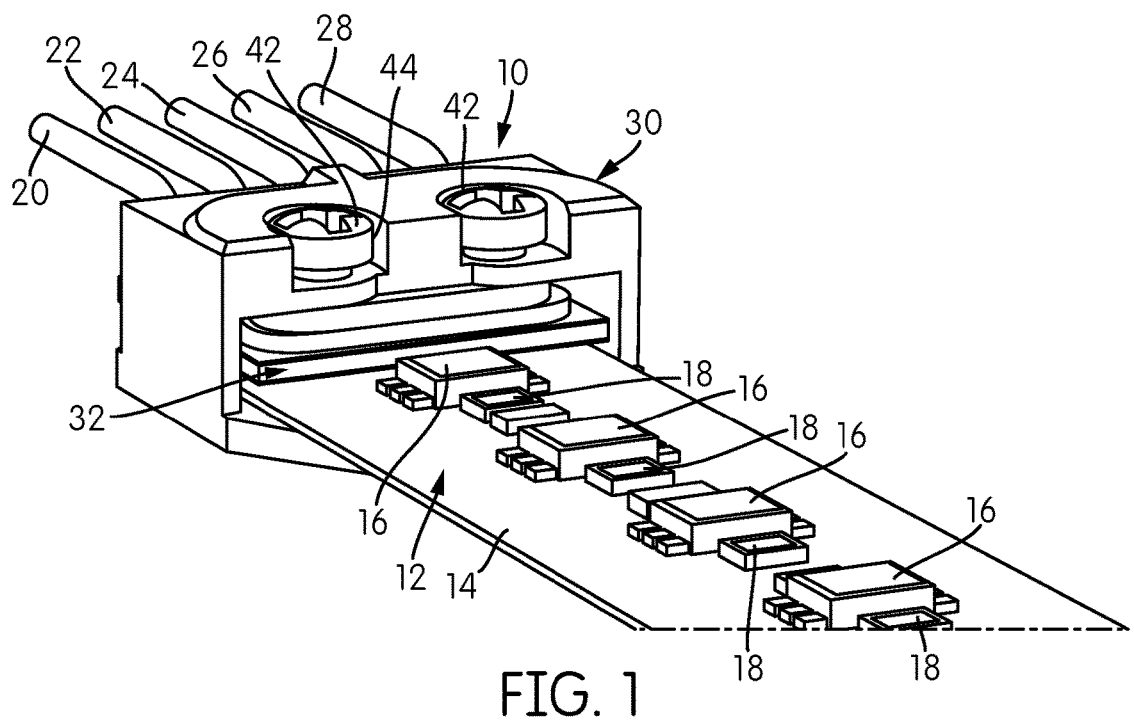
FIG. 1 is a perspective view of a connector according to one embodiment of the invention, shown with a strip of linear lighting installed.

FIG. 1 is a perspective view of a connector, generally indicated at 10, according to one embodiment of the invention, shown with a strip of linear lighting 12 installed.

In the illustrated embodiment, the strip of linear lighting 12 comprises a printed circuit board (PCB) 14 with components surface mounted on it. In particular, the strip of linear lighting has a set of RGB LED light engines 16 spaced along its length. Additionally, immediately adjacent to each RGB light engine 16 is a blue-pump light engine 18 designed to emit white light of a predefined color temperature. Here, the term "light engine" refers to a package that contains one or more LEDs along with the wires and contacts necessary to connect the package to a PCB 14. In this embodiment, the light engines are packaged for surface mounting, although through-hole mounting and other forms of mounting may be used in other embodiments. The blue-pump light engines 18 include a phosphor positioned over the LED or LEDs. In this particular strip of linear lighting, the RGB LED light engines may, e.g., be packaged in a 5050 package, while the blue-pump LED light engines may be packaged in a smaller 3528 or 2835 package.

As relevant here, the strip of linear lighting 12 affords independent control of red, green, blue, and white light emission. Thus, it requires a larger number of electrical connections. Specifically, with the illustrated strip of linear lighting 12, there are five separate connections that are made: voltage/signal lines for each of the red, green, and blue channels, a voltage/signal line for the white light LED, and a common anode or cathode. Thus, five conductors 20, 22, 24, 26, 28 are shown in the view of FIG. 1. If the strip of linear lighting 12 included, e.g., a second series of blue pump light engines to emit white light of a different color temperature, there would be another conductor to provide voltage/signal for those light engines.

Of course, a strip of linear lighting 12 is a microelectronic circuit on a PCB 14. That circuit can have more than just LED light engines 16, 18 in it, and a strip of linear lighting according to an embodiment of the invention might require any number of connections. As the number of connections increases, it can become much more difficult to make those connections by conventional soldering.

The connector 10 of FIG. 1 comprises two main parts: an outer shell or block 30 and an adapter 32. The adapter 32 makes the electrical connections between the strip of linear lighting 12 and a set of wires or other electrical conductors 20, 22, 24, 26, 28. The shell or block 30 of the connector 10 surrounds at least a portion of the adapter 32 and at least a portion of the strip of linear lighting 12, providing clamping force to create and maintain a mechanical and an electrical connection between the adapter and the strip of linear lighting 12.

Figure 2:
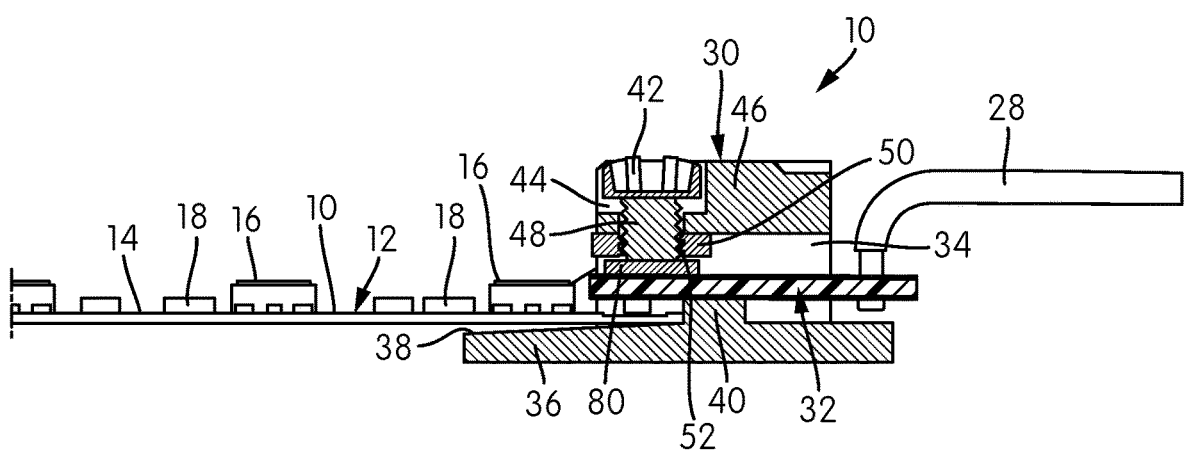
FIG. 2 is a cross-sectional view of the connector of FIG. 1.

The details of the arrangement can be seen more clearly in FIG. 2, a cross-sectional view of the connector 10 of FIG. 1, again shown with the strip of linear lighting 12 attached. The connector 10 defines a relatively large internal cavity 34 that is open at both the front and the back. The base 36 is relatively long, extending some distance in the back and a longer distance in the front. The front portion of the base 36 provide a support surface 38 for the strip of linear lighting 12 that has a slight downward slope in the illustrated embodiment. The support surface 38 may, for example, be used to secure the strip of linear lighting 12 with pressure-sensitive adhesive or adhesive tape. The support surface 38 and its sloped "ramp" may provide strain relief to the connection. The details and advantages of this are further explained in U.S. Pat. No. 10,826,202, the contents of which are incorporated by reference herein in their entirety.

The adapter 32 rests on a bar 40 that arises from the base 36 and extends across the width of the block 30. The adapter 32 is clamped in place, and pressure is supplied for mechanical connection, by two screws 42 that are seated in recessed cavities 44 in the top 46 of the block 30. The screws 42 may be relatively small, such as M2 screws. The screw shafts 48 pass through a portion of the top 46 of the block 30 and are secured in place by a bar 50 with corresponding threaded openings 52. In this embodiment, the screw shafts 48 contact the adapter 32 at a position just forward of the bar 40 on which the adapter 32 rests. This may minimize bending stresses on the adapter 32.

While a traditional electrical connector might have as many screws as there are electrical connections to be made, as can be seen particularly in FIG. 1, in the illustrated embodiment, there are five conductors 20, 22, 24, 26, 28 but only two screws 42. In embodiments of the invention, there may often be fewer screws 42 than there are electrical conductors 20, 22, 24, 26, 28. The reason for that lies in the configuration of the adapter 32.

Figure 3:
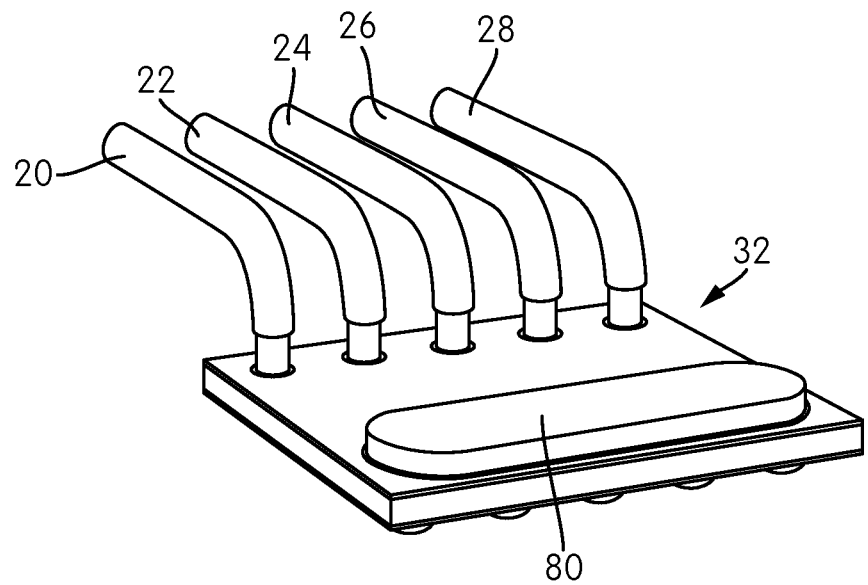
FIG. 3 is a top perspective view of an adapter board used with the connector of FIG. 1, shown in isolation.
Figure 4:
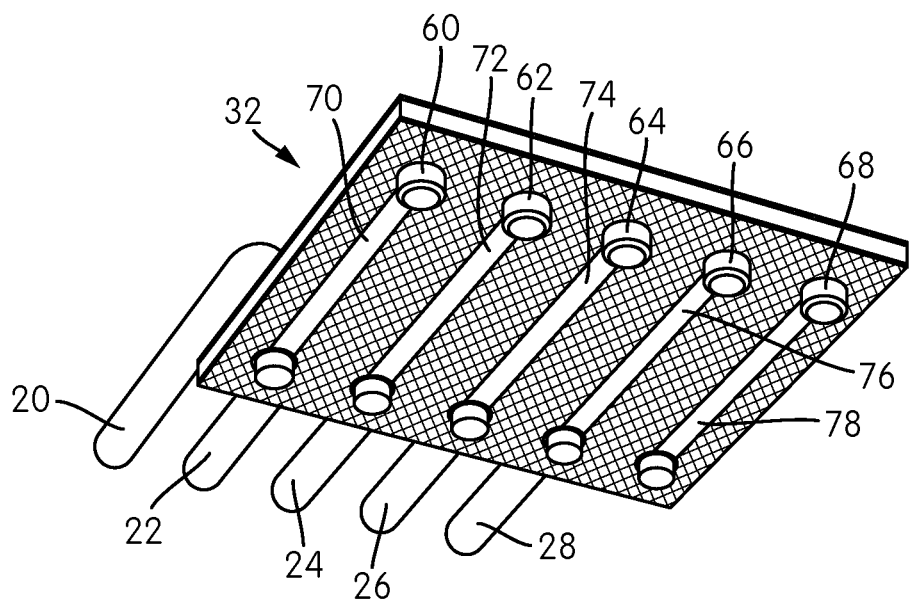
FIG. 4 is a bottom perspective view of the adapter board of FIG. 3.

FIGS. 3 and 4 are top perspective and bottom perspective views, respectively, of the adapter 32 in isolation. In essence, the adapter 32 handles all of the necessary electrical connections, while the block 30 acts only as a clamp. More specifically, in this embodiment, the adapter 32 is a small section of rigid PCB. In this embodiment, the adapter 32 is made using a piece of FR4 PCB. In other embodiments, other types of rigid PCB and other rigid materials may be used. For example, the adapter 32 may be made using a section of ceramic or metallic PCB. In yet other embodiments, the adapter could be comprised of a flexible PCB, such as a thin polyimide or biaxially-oriented polyethylene terephthalate (BoPET; MYLAR®) film PCB, secured to a more rigid carrier, such as a thick section of plastic, wood, or, in some cases, metal. When considering the definitions of "flexible" and "rigid," one should keep in mind that rigidity is a function of both the material and its thickness; materials that are conventionally thought-of as rigid may be flexible enough to be used in thin section.

With respect to FIGS. 3 and 4, in this embodiment, the conductors 20, 22, 24, 26, 28, 30 are through-hole mounted proximate to one edge or side of the adapter 32. The electrical conductors 20, 22, 24, 26, 28 may be individual wires, the wires of a multi-conductor cable, or other such structure. The mounting would typically be done by soldering, or by heating solder in the holes or vias and inserting the conductors 20, 22, 24, 26, 28, 30.

The underside of the opposite edge or side of the adapter 32 includes a series of pin contacts 60, 62, 64, 66, 68. The pin contacts 60, 62, 64, 66, 68 may be formed with conventional lithographic processes or created in some other way and machined or otherwise formed to the desired shape. The conductors 22, 24, 26, 28, 30 and the pin contacts 60, 62, 64, 66, 68 are electrically connected by a corresponding set of conductors 70, 72, 74, 76, 78 that are defined on or in the adapter 32 with typical PCB manufacturing processes. The conductors 70, 72, 74, 76, 78 would typically be copper, but other conductive materials may be used in other embodiments, including, e.g., aluminum and gold. The conductors 70, 72, 74, 76, 78 and pins 60, 62, 64, 66, 68 would generally be made with enough conductive material to carry all the current expected in the application, with some margin for safety. Although shown on a single layer for ease of illustration, the conductors 70, 72, 74, 76, 78 may be constructed in multiple portions and distributed among multiple layers of a PCB using vias or other layer-connecting structure.

On the upper surface of the adapter 32, directly over the position of the pin contacts 60, 62, 64, 66, 68 on the underside, lies a contact bar 80. The contact bar 80 is essentially a stiffener, placed to receive mechanical force from the screws 42 and reinforce the adapter 32 where that force is greatest. It is electrically isolated from the conductors 70, 72, 74, 76, 78 and any other electrically-conductive elements of the adapter 32. As those of skill in the art might appreciate, in some cases, if the adapter 32 itself is made of a particularly stiff or durable material, the contact bar 80 may not be needed.

The connector 10 has numerous advantages. For example, as was noted above, the screws 42 are used only to provide distributed clamping force; the adapter 32 makes the necessary connections. Thus, there can be fewer screws 42 than there are electrical connections. In fact, in some embodiments, it may be possible to use only one large screw. Meanwhile, the contact pins 60, 62, 64, 66, 68 on the adapter 32 can be made to any desired pitch, in many cases using the same kinds of microelectronic manufacturing processes and techniques that are used to create the strip of linear lighting 12 itself. The adapter 32 could also be modified to accommodate more conductors. For example, if there are more conductors, those conductors could be through-hole mounted in multiple rows that are offset from one another, meaning that a single adapter 32 might be able to accommodate ten or even fifteen conductors if needed. Moreover, while the conductors 70, 72, 74, 76, 78 on the adapter 32 are straight and of constant width in this embodiment, they could vary in pitch, width, and other characteristics over their length. For example, in other embodiments, such conductors 70, 72, 74, 76, 78 could be more widely spaced around the through-hole mounts and more narrowly spaced at the opposite side of the adapter 32, so that more contact pins 60, 62, 64, 66, 68 can be packed into the space.

Most strips of RGB, RGBW, and RGBWW linear lighting use wide PCB in order to provide space for the solder pads and, in some cases, the conductive traces that are necessary for such linear lighting. These conventional strips of linear lighting may be, e.g., 12-14 mm (0.47-0.55 inches) wide or wider. Using a connector 10 like that shown in FIGS. 1-4 avoids the need to solder to the strip of linear lighting and may make it possible to make an RGBW or RGBWW strip of linear lighting with a width more on the order of 8-10 mm (0.31-0.39 inches) or narrower.

Additionally, as may be apparent from the above, the adapter 32 and block 30 are designed such that the adapter 32 is removable from the block 30. This means that the same block 30 may be used with different types of adapters 32 to accommodate different types of linear lighting. That reusability adds to the versatility and interchangeability of the connector 10 and may make it less expensive to stock, because only the adapter 32 need vary to accommodate different types of linear lighting.

In addition to advantages in versatility and adaptability, the connector 10 may have a practical advantage for installers, as compared with traditional connectors: fewer screws to tighten.

The connector 10 of FIG. 1 is designed specifically to make and maintain low-voltage connections, although it would be possible to make high-voltage connections as well. Although the definitions of "low voltage" and "high voltage" vary depending on the authority one consults, for purposes of this description, "low voltage" should be considered to be any voltage under 50V. Most strips of linear lighting operate at, e.g., 12V or 24V, although some strips of linear lighting are manufactured that operate at lower voltages, or at voltages close to 50V.

Typically, the outer shell or block 30 of the connector 10 would be made of a plastic, like polyethylene, polyethylene terephthalate (PET), or acrylonitrile-butadiene-styrene (ABS) plastic, or another nonconductive material, although in some cases, metals and other conductive materials may be used so long as care is taken to see that the material does not short out the various connections. The material of which the outer shell or block 30 is made would generally meet prevailing flame and other safety standards for low-voltage connectors.

As was noted above, one purpose of the outer shell or body 30 is to provide clamping force. The connector 10 of FIGS. 1-4 does that through its screws 42. However, there are other ways to accomplish this function.

Figure 5:
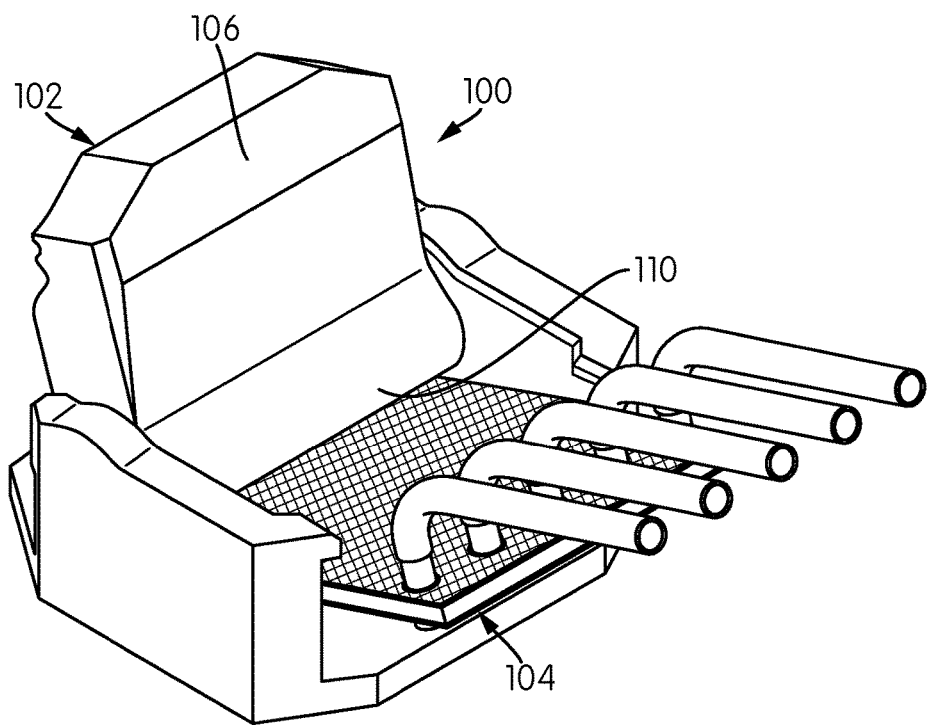
FIG. 5 is a perspective view of a connector according to another embodiment of the invention.
Figure 6:
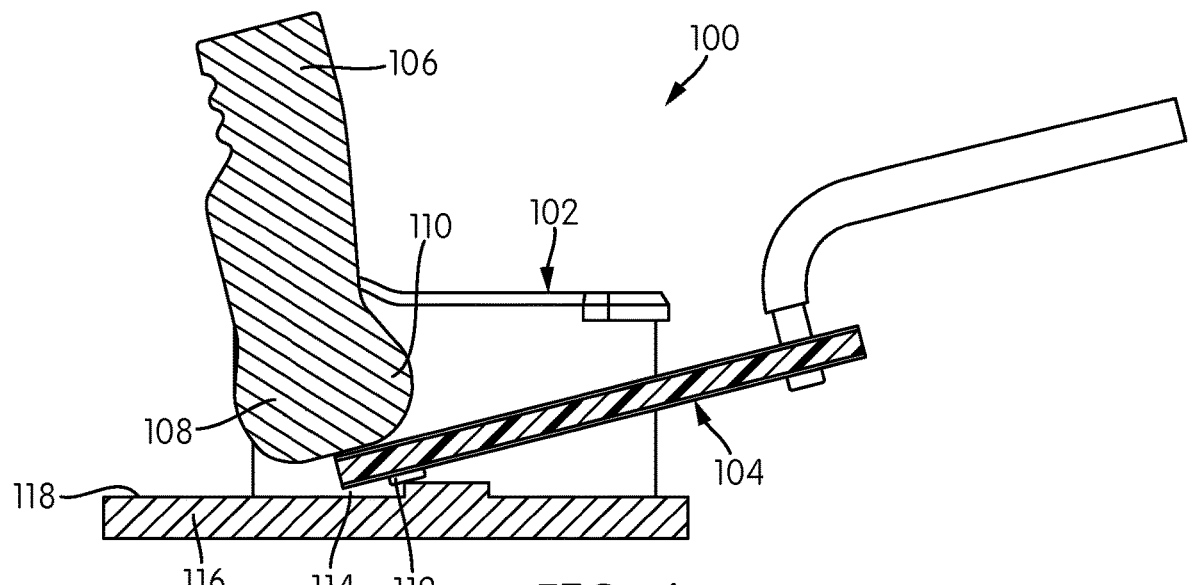
FIG. 6 is a cross-sectional view of the connector of FIG. 5.

FIG. 5 is a perspective view of a connector 100 according to another embodiment of the invention, taken from the rear, and FIG. 6 is a cross-sectional view of the connector 100 of FIG. 5, shown without a strip of linear lighting 12 installed. The connector of this embodiment also has an outer shell or block 102 in which an adapter 104 is installed. The adapter 104 may be assumed to have the same, or generally the same, features as the adapter 32 described above, although it may be different in some embodiments. The outer shell or block 102 of the connector in this embodiment is different. In particular, the connector 100 uses a different type of pressure-applying mechanism.

More specifically, in this embodiment, instead of screws, the connector of FIGS. 5-6 has a lever 106 pivotably attached to the outer shell or block 102. The lever 106 has a cam 108 on a lower surface, a lobe 110 of the cam 108 shaped and positioned to apply downward pressure when the other end of the lever 106 is pressed down into the outer shell or block 102. As shown in FIGS. 5-6, the adapter 104 inserts into the outer shell or block 102 such that its contact pins, generally indicated at 112, are directly beneath the position that the cam lobe 110 will reach when the lever 106 is pressed down. The adapter 104 does not use a contact bar 80 or other stiffener where it contacts the cam lobe 110. Although one may be used in some embodiments, because the pressure applied by the cam lobe 110 is distributed across the entire width of the adapter 104 (i.e., as compared with one or two points of contact when screws 42 are used), a contact bar 80 may not be necessary.

Beneath the adapter 104 is a slot 114 for the insertion of a strip of linear lighting 12. The base 116 of the connector 100 has a support surface 118 for a strip of linear lighting 12 that provides some strain relief. Thus, the connector 100 otherwise has generally the same features as the connector 10 described above.

With the connector 100, when the strip of linear lighting 12 is inserted in its slot 114 beneath the adapter 104, the camming lever 106 can simply be rotated down in order to make the necessary physical and electrical connection. The distal end of the lever may be knurled, textured, or otherwise modified to make it easy to apply pressure with a finger or a thumb.

In both of the embodiments described above, it is assumed that the pressure applied by the screws 42 or the lever 106 is reversible. That is, if pressure is applied to the strip of linear lighting 12, that pressure can be withdrawn and the strip of linear lighting 12 removed from the connector 10, 100 without damage. However, in some embodiments, the set of pins 60, 62, 64, 66, 68 may be shaped to pierce or penetrate the electrical contacts of the strip of linear lighting in order to increase the strength of the mechanical connection and to reduce the possibility of pullout. Additionally, the adapter 32 may include other piercing, penetrating, or friction-improving components that bear on other portions of the strip of linear lighting 12 to improve the connection between the connector 10, 100 and the strip of linear lighting 12, like unidirectional barbs. Moreover, additional structure may be provided to lock the screws 42 or the lever 106 into place so as to prevent inadvertent release of pressure, as might be caused by vibration, thermal expansion, or other such phenomena.

While the invention has been described with respect to certain embodiments, the description is intended to be exemplary, rather than limiting. Modifications and changes may be made within the scope of the invention, which is defined by the appended claims.

What is claimed is:

1. A connector for linear lighting, comprising:
a shell, including a base, a top, and a cavity defined between the base and the top and a pressure-applying mechanism extending into the cavity; and
an adapter configured to be inserted into the cavity to rest on the base or a portion thereof, the adapter having an upper face and a lower face, a first side of the adapter having first electrical contacts adapted to connect to two or more wires, and an opposite side of the adapter having second electrical contacts on the underside, the first electrical contacts and the second electrical contacts being in electrical communication with one another, the position of the adapter when inserted into the cavity being such that a slot is defined between the second electrical contacts and the base;
wherein the pressure-applying mechanism is constructed and arranged to apply mechanical pressure to the upper face of the adapter when the adapter is inserted into the cavity such that the mechanical pressure is conveyed to and through the second electrical contacts on the underside of the adapter; and
wherein the base extends beyond the cavity and forms a support surface.

2. The connector of claim 1, wherein the base comprises a raised bar that extends across an interior width of the cavity and the adapter is sized and configured to rest on the raised bar.

3. The connector of claim 1, wherein the support surface is sloped.

4. The connector of claim 1, wherein the cavity is open at front and back faces thereof.

5. The connector of claim 4, wherein the adapter is sized and further configured to be removable from the cavity when the mechanical pressure is withdrawn.

6. The connector of claim 1, wherein the adapter comprises a printed circuit board (PCB).

7. The connector of claim 6, wherein the first electrical contacts are holes or vias sized and configured to permit through-hole mounting of the two or more wires.

8. The connector of claim 7, wherein the second electrical contacts comprise a set of pins depending from the underside of the adapter.

9. The connector of claim 8, wherein the PCB further comprises conductive structure that places the holes or vias and the set of pins in electrical contact with one another.

10. The connector of claim 9, further comprising a stiffener on the upper face of the adapter opposite the set of pins, the stiffener being electrically isolated from other components of the adapter and providing a bearing surface for the pressure-applying mechanism.

11. The connector of claim 1, wherein the pressure-applying mechanism comprises one or more screws that extend through the top of the shell and are positioned to bear on the upper face of the adapter when the adapter is inserted into the cavity.

12. The connector of claim 11, wherein shafts of the one or more screws insert into corresponding threaded holes of a structure positioned in the cavity below the top.

13. The connector of claim 11, wherein the one or more screws comprises fewer screws than the number of the first electrical contacts.

14. The connector of claim 1, wherein the pressure-applying mechanism comprises a lever pivotably mounted to the top of the shell, the lever including at least one cam lobe positioned to exert pressure on the adapter when the adapter is inserted into the cavity and the lever is pivoted to a pressure-applying position.

15. The connector of claim 1, wherein the pressure-applying mechanism is further configured to allow the mechanical pressure to be withdrawn so as to open the slot.

16. A connector for linear lighting, comprising:
a shell, including a base, a top, and a cavity defined between the base and the top and a pressure-applying mechanism extending into the cavity; and
an adapter configured to be inserted into the cavity to rest on the base or a portion thereof, the adapter having an upper face and a lower face, a first side of the adapter having first electrical contacts adapted to connect to two or more wires, and an opposite side of the adapter having second electrical contacts on the underside, the first electrical contacts and the second electrical contacts being in electrical communication with one another, the position of the adapter when inserted into the cavity being such that a slot is defined between the second electrical contacts and the base;
wherein the pressure-applying mechanism is constructed and arranged to apply mechanical pressure to the upper face of the adapter when the adapter is inserted into the cavity such that the mechanical pressure is conveyed to and through the second electrical contacts on the underside of the adapter; and
wherein the pressure-applying mechanism comprises one or more screws that extend through the top of the shell and are positioned to bear on the upper face of the adapter when the adapter is inserted into the cavity.

17. The connector of claim 16, wherein shafts of the one or more screws insert into corresponding threaded holes of a structure positioned in the cavity below the top.

18. The connector of claim 16, wherein the one or more screws comprises fewer screws than the number of the first electrical contacts.

19. A connector for linear lighting, comprising:
a shell, including a base, a top, and a cavity defined between the base and the top and a pressure-applying mechanism extending into the cavity; and
an adapter, comprising a printed circuit board, configured to be inserted into the cavity to rest on the base or a portion thereof, the adapter having an upper face and a lower face, a first side of the adapter having first electrical contacts adapted to connect to two or more wires, and an opposite side of the adapter having second electrical contacts on the underside, the first electrical contacts and the second electrical contacts being in electrical communication with one another, the position of the adapter when inserted into the cavity being such that a slot is defined between the second electrical contacts and the base;
wherein the pressure-applying mechanism is constructed and arranged to apply mechanical pressure to the upper face of the adapter when the adapter is inserted into the cavity such that the mechanical pressure is conveyed to and through the second electrical contacts on the underside of the adapter;

wherein the first electrical contacts are holes or vias that are sized and configured to permit through-hole mounting of the two or more wires; and wherein the second electrical contacts comprise a set of pins depending from the underside of the adapter.

20. The connector of claim 19, wherein the pressure-applying mechanism comprises one or more screws that extend through the top of the shell and are positioned to bear on the upper face of the adapter when the adapter is inserted into the cavity.

21. The connector of claim 19, wherein the pressure-applying mechanism comprises a lever pivotably mounted to the top of the shell, the lever including at least one cam lobe positioned to exert pressure on the adapter when the adapter is inserted into the cavity and the lever is pivoted to a pressure-applying position.

\* \* \* \* \*